United States Patent
Lee et al.

(10) Patent No.: US 7,505,750 B2
(45) Date of Patent: Mar. 17, 2009

(54) MIXER TRANSCONDUCTANCE IN RF TRANSCEIVER

(75) Inventors: C. Paul Lee, San Diego, CA (US); Arya Reza Behzad, Poway, CA (US); Michael Steven Kappes, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 487 days.

(21) Appl. No.: 11/287,805

(22) Filed: Nov. 28, 2005

(65) Prior Publication Data

US 2007/0004368 A1 Jan. 4, 2007

Related U.S. Application Data

(60) Provisional application No. 60/696,261, filed on Jul. 1, 2005.

(51) Int. Cl.
*H04B 1/26* (2006.01)
*H04Q 7/20* (2006.01)

(52) U.S. Cl. .............. 455/323; 455/118; 327/359; 330/267

(58) Field of Classification Search ............. 455/323, 455/326, 341, 118; 327/113, 116, 359; 330/254, 330/263, 267
See application file for complete search history.

(56) References Cited

U.S. PATENT DOCUMENTS

2004/0106380 A1* 6/2004 Vassiliou et al. ............. 455/73

* cited by examiner

*Primary Examiner*—Lee Nguyen
(74) *Attorney, Agent, or Firm*—Garlick Harrison & Markison; James A. Harrison (57) ABSTRACT

An integrated circuit radio transceiver and method therefor comprises circuitry that is operable to up-convert an outgoing continuous waveform signal to RF and that is further operable to down-convert and ingoing RF signal to one of a baseband or intermediate frequency in a manner that provides a linearized output current having an amplified current magnitude for mixing with a local oscillation in a mixer block. Specifically, a circuit portion is operable to produce a linearized current based upon an input signal. The linearized current is then produced to a current mirror block that produces a scaled and amplified output current. The scaled and amplified output current is then produced to a mixer block for mixing with a local oscillation to create the outgoing RF signal or the ingoing baseband or intermediate frequency signal.

29 Claims, 9 Drawing Sheets

MIXER TRANSCONDUCTANCE IN RF TRANSCEIVER

CROSS REFERENCE TO RELATED APPLICATION

This application claims priority to U.S. Provisional Patent Application Ser. No. 60/696,261, filed Jul. 1, 2005, which is incorporated herein by reference for all purposes.

BACKGROUND

1. Technical Field

The present invention relates to wireless communications and, more particularly, to radio front end circuitry for up-converting and down-converting outgoing and ingoing radio communication signals.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bipolar circuitry, allowing for large signal swings and linear transmitter component behavior. Therefore, many legacy baseband processors employ analog interfaces that communicate analog signals to and from the radio processor.

One common problem in a radio front end is that known techniques for linearizing a voltage-to-current relationship in a transconductance block reduces an amount of available output current. Accordingly, in applications requiring a greater output current magnitude, a linearized response is often sacrificed because a tradeoff exists between current output and linearization. Accordingly, what is needed, is a circuit and method for linearizing a voltage-to-current relationship for an input signal, while also producing a satisfactory and amplified output current magnitude.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
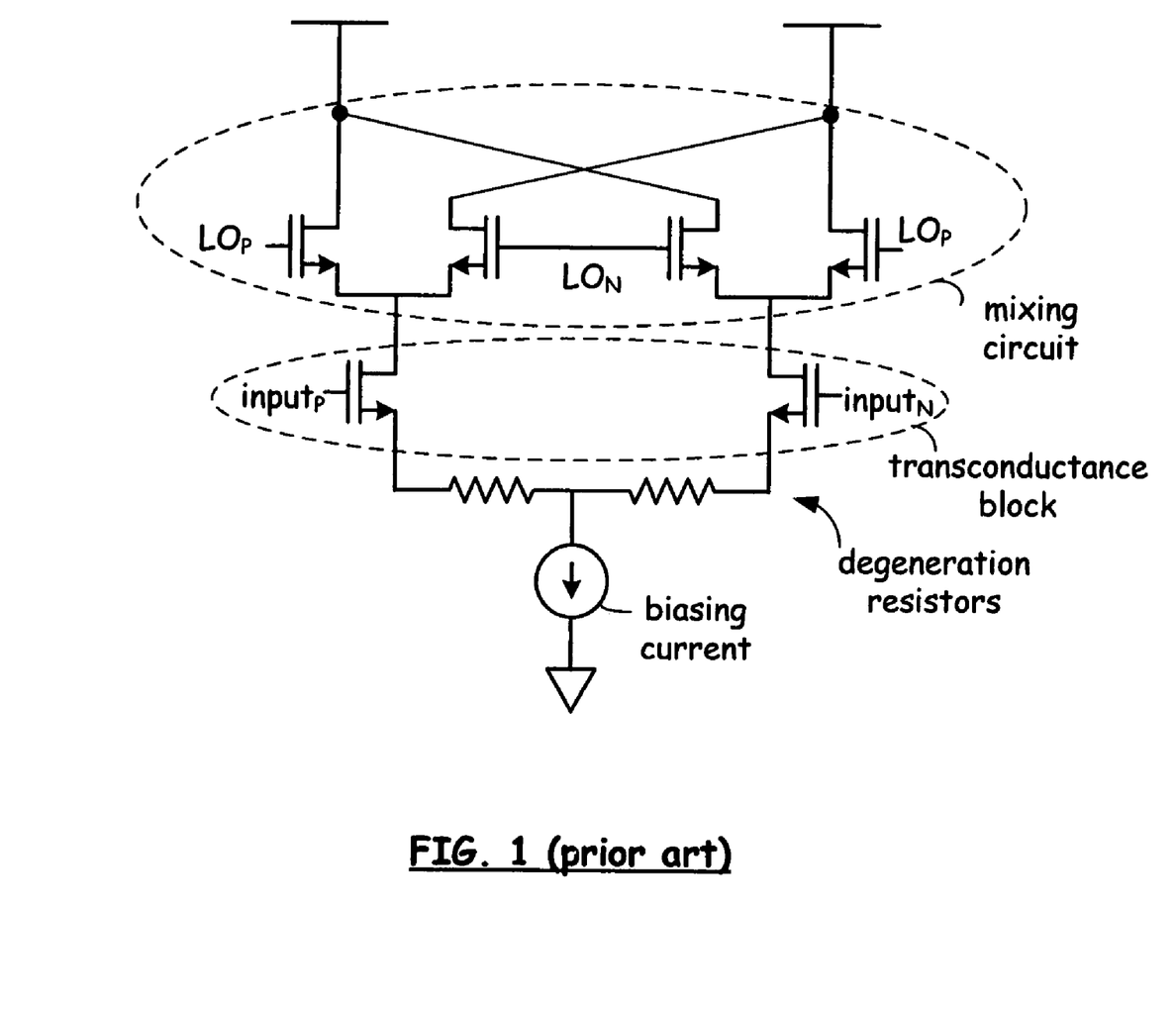
FIG. 1 is a functional schematic diagram of a prior art Gilbert cell mixer with degeneration resistors.

FIG. 1 is a functional schematic diagram of a prior art Gilbert cell mixer with degeneration resistors. As may be seen, the prior art Gilbert cell mixer includes a mixing circuit that contains four MOSFET transistors connected substantially as shown, and a transconductance block that includes two input transistors connected to the mixing circuit, as shown here in FIG. 1. The prior art Gilbert cell mixer of FIG. 1 is differential and includes differential inputs for the transconductance block. As may be seen, referring to the mixing circuit, a differential local oscillation is provided to the four MOSFETs of the mixing circuit as shown. Further, the MOSFETs of the mixing circuit are cross-coupled. The biasing current is provided by a current source, or more technically, a current sink, that is coupled to circuit common. As may be seen, pair of degeneration resistors is coupled between a source terminal of each of the two input MOSFETs of the transconductance block and the current supply that provides the biasing current. It is known to use such degeneration resistors in bipolar transistor circuit applications. Such degeneration resistors are operable to linearize the voltage-to-current relationship between the differential input voltage signal received by the transconductance block and a corresponding output current of the transconductance block. As is known by one of average skill in the art, the circuit configuration of FIG. 1 effectively results in the multiplication of the inputs for the transconductance block with the inputs of the mixing circuit, namely, the local oscillation. Because the multiplication of two sinusoidal signals results in outputs at multiple frequencies, filtering is often used to block out unwanted frequency components of the final output of the prior art Gilbert cell mixer. Generally, increasing the resistance of the degeneration resistors is operable to improve linearity, but reduces the output current magnitude of the transconductance block. In applications in which a higher output current magnitude is required, the prior art Gilbert cell mixer of FIG. 1 may not satisfy design requirements.

Figure 2:
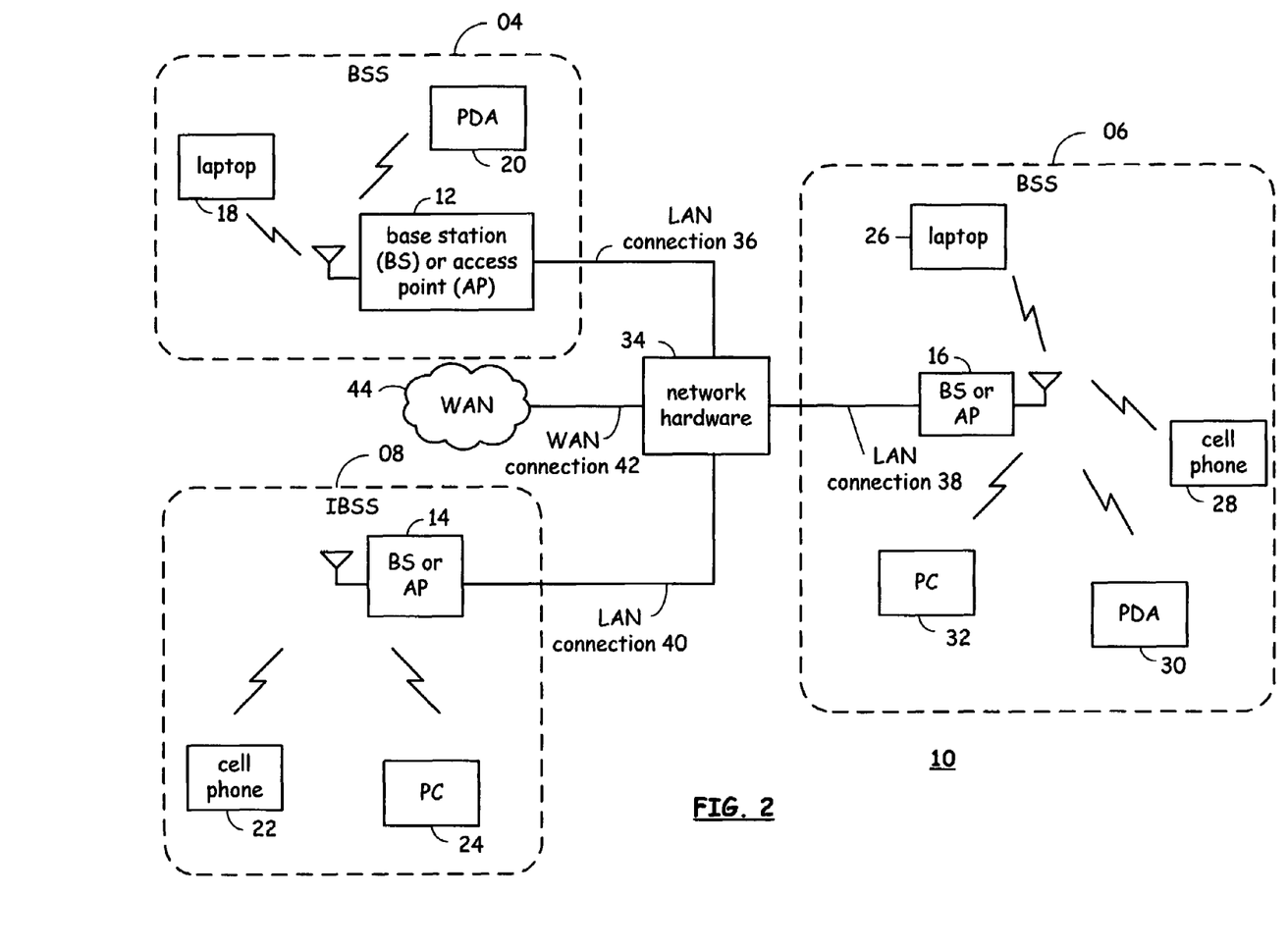
FIG. 2 is a functional block diagram illustrating a communication system that includes circuit devices and network elements and operation thereof according to one embodiment of the invention.

FIG. 2 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 3-7.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the network 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the network 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 3:
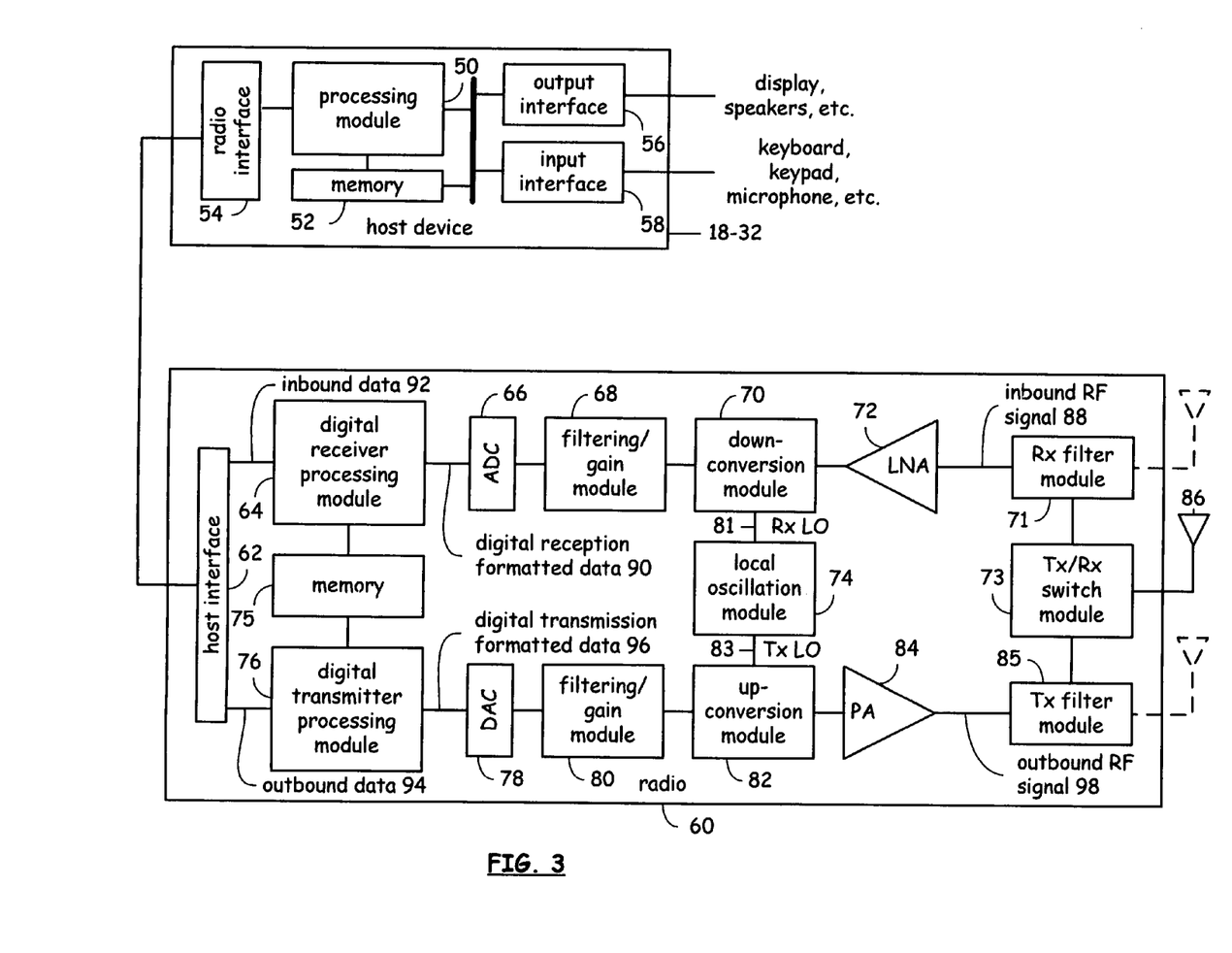
FIG. 3 is a schematic block diagram illustrating a wireless communication host device and an associated radio.

FIG. 3 is a schematic block diagram illustrating a wireless communication host device 18-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11a, IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 3 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 4:
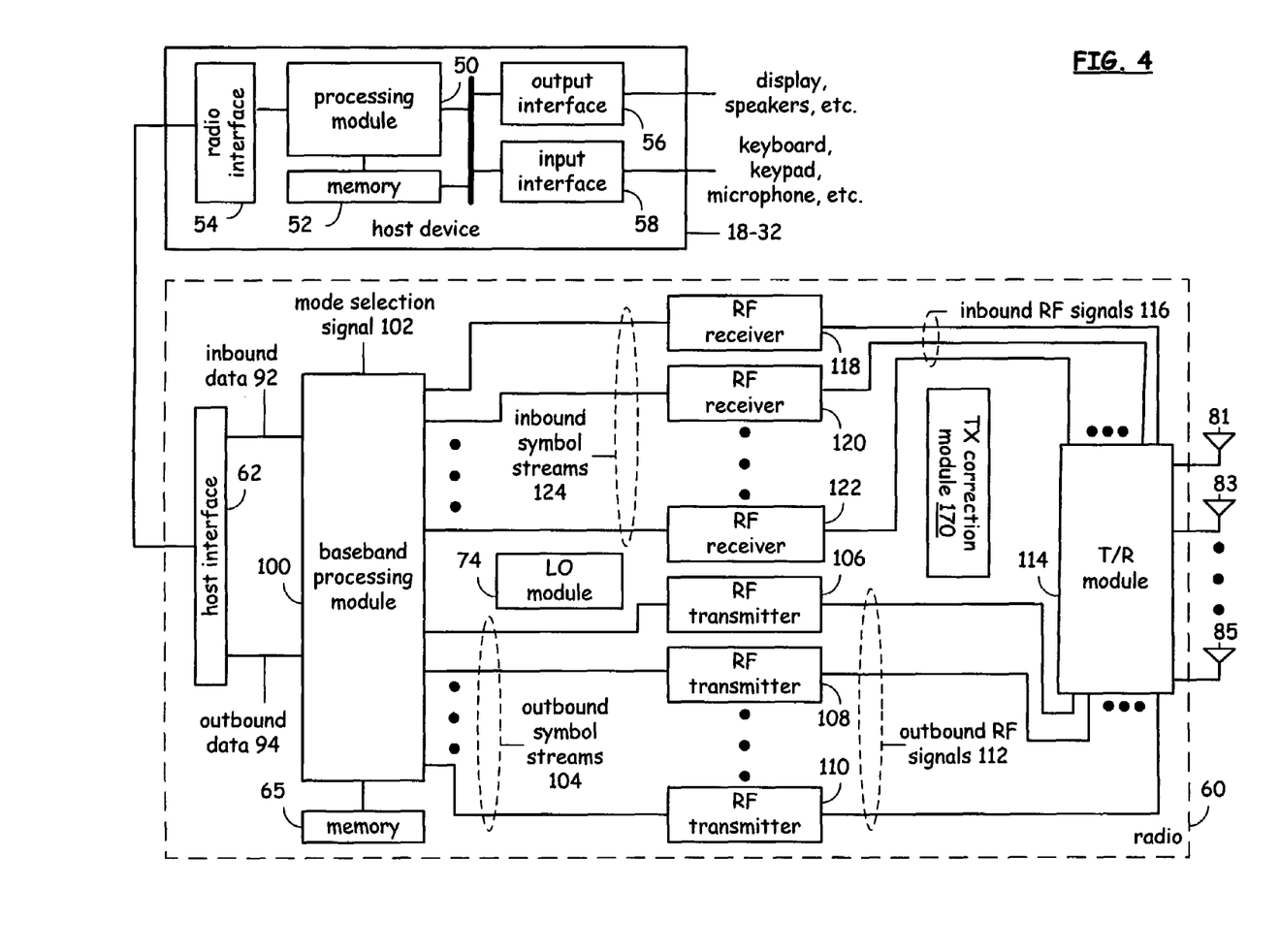
FIG. 4 is a schematic block diagram illustrating a wireless communication device that includes a host device and an associated radio.

FIG. 4 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-122, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal 102 will further indicate a particular rate ranging from 1 megabit-per-second to 54 megabits-per-second. In addition, the mode selection signal 102 will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102, produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up-conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receiver 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 4 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 of host device 18-32 and memory 65 of radio 60 may be implemented on a single integrated circuit and/or on the same integrated circuit as the common processing modules of processing module 50 of host device 18-32 and the baseband processing module 100 of radio 60.

Figure 5:
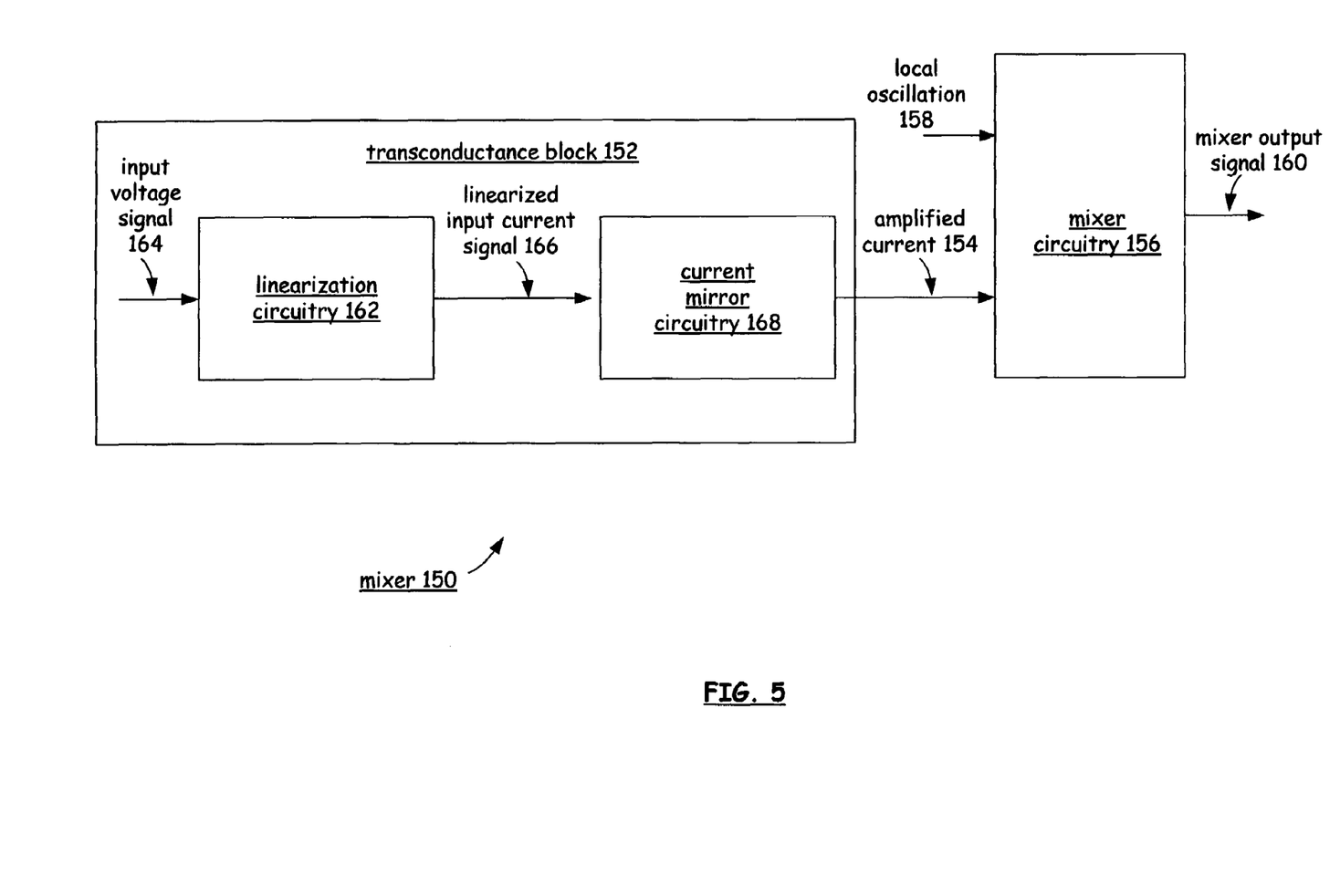
FIG. 5 is a functional block diagram of a mixer according to one embodiment of the present invention.

FIG. 5 is a functional block diagram of a mixer according to one embodiment of the present invention. A mixer 150 includes a transconductance block 152 that is operable to produce an amplified current 154 to mixer circuitry 156. Mixer circuitry 156 is operably connected to receive a local oscillation 158 that is mixed with amplified current 154 to produce a mixer output signal 160.

Transconductance block 152 further includes linearization circuitry 162 that is operably coupled to receive an input voltage signal 164 and to produce a linearized input current signal 166 that is based upon the input voltage signal 164. Current mixer circuitry 168 is operably coupled to receive linearized input current signal 166 and produces the amplified current 154 based upon the linearized input current signal 166.

Generally, mixer 150 is operable to produce a mixed output signal that is based upon a linearized amplified current, thereby satisfying both linearization requirements and current magnitude requirements. More specifically, linearization circuitry 162 is operable to produce a linearized input current signal based upon an input voltage signal. In one embodiment of the invention, as will be described in greater detail below, linearization circuitry 162 merely includes degeneration resistors that are operable to linearize the output current. In an alternate embodiment of the invention, a feedback circuit path with active circuit components is included within linearization circuitry 162 that are operable to steer current in and out of one of an output node or output degeneration resistors to further linearize a current signal based upon the input voltage. Accordingly, referring back to FIG. 5, linearized input current signal 166 has improved linearization, or a linear relationship between voltage and current, based upon the input voltage signal. Current mirror circuitry 168 is operable to receive the linearized input current signal 166 and to produce a linearized amplified current 154 that, in the described embodiment, as will be described in greater detail, is a scaled product of the linearized input current signal 166.

Figure 6:
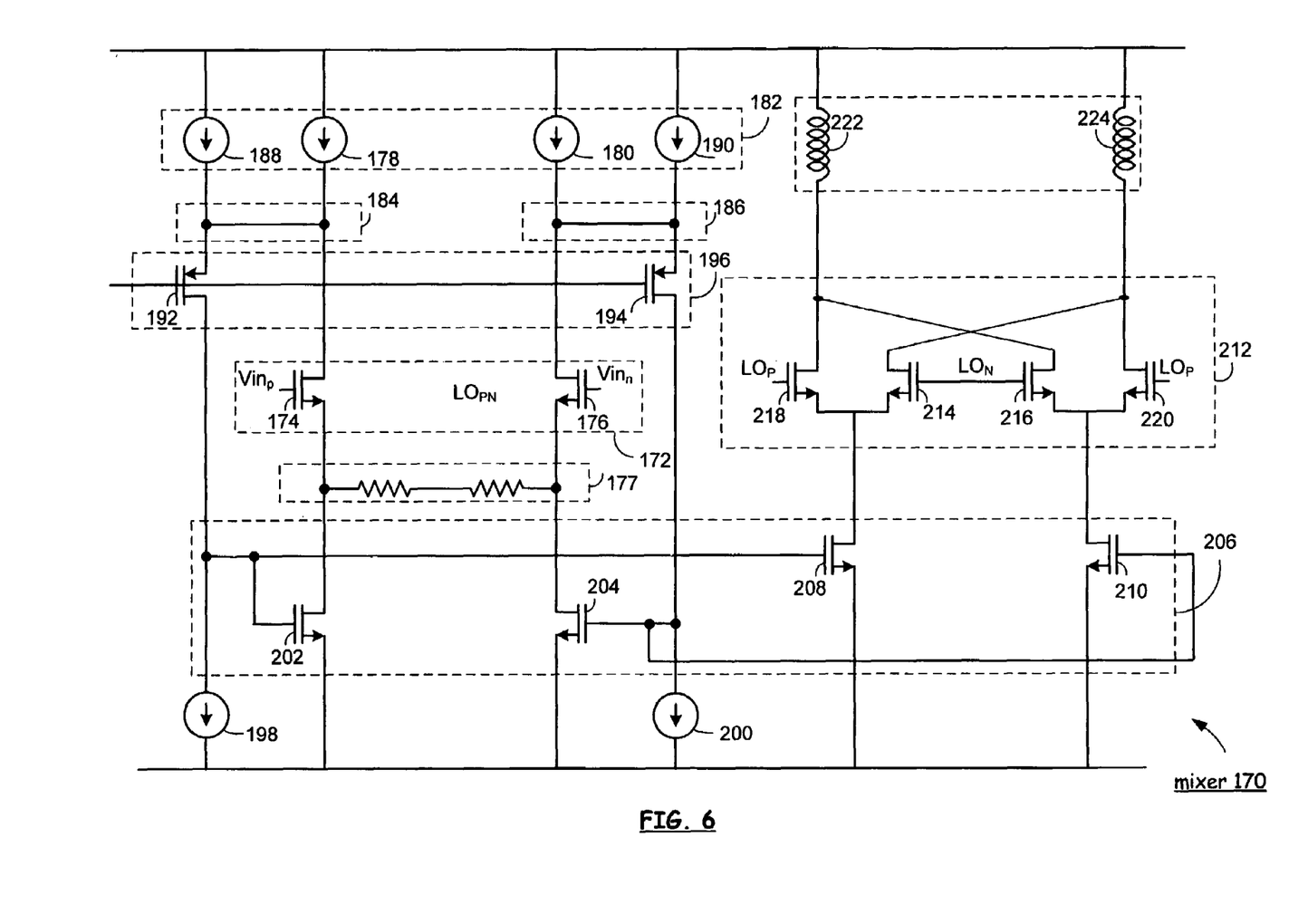
FIG. 6 is a functional schematic diagram of a mixer block according to one embodiment of the invention.

FIG. 6 is a functional schematic diagram of a mixer block according to one embodiment of the invention. A mixer 170 includes a differential input transistor pair, referenced herein as input transistors 172, which are operably coupled to receive a differential input voltage signal $Vin_p$ and $Vin_n$. Specifically, input transistors 172 include MOSFETs 174 and 176 which, in the described embodiment of the invention, are n-channel MOSFETs. The input transistors 172 are coupled to degeneration resistors 177 that are coupled in series and, as a pair, connect the source terminals of MOSFETs 174 and 176. The drain terminals of MOSFETs 174 and 176 are coupled directly to current sources 178 and 180, respectively, of current block 182.

The drain terminals of MOSFETs 174 and 176 are also coupled to feedback circuit paths 184 and 186, respectively, that operatively couple said drain terminals to current sources 188 and 190, respectively, also of current block 182. Further, the drain terminals of MOSFETs 174 and 176 are coupled to the source terminals of MOSFETs 192 and 194 of biasing circuit 196 by way of feedback circuit paths 184 and 186, respectively. MOSFETs 192 and 194 are p-channel MOSFETs whose gate terminals are operatively coupled to a biasing voltage to operatively bias MOSFETs 192 and 194. The drain terminals of MOSFETs 192 and 194 are coupled to current sinks 198 and 200, respectively, and to gate terminals of MOSFETs 202 and 204 of current mirror block 206. The drain terminals of MOSFETs 202 and 204 are also coupled to a common node that is further coupled to degeneration resistors 177 and the source terminals of MOSFETs 174 and 176 of input transistors 172. The source terminals of MOSFETs 202 and 204 are coupled to circuit common, as is current sink 198 and current sink 200.

In operation, the circuitry described above includes a degeneration circuit that comprises feedback circuit paths 184 and 186, as well as degeneration resistors 177. The plurality of current sources of current block 182 and current sinks 198 and 200, are operable to steer current in and out of the drain terminals of MOSFETs 174 and 176 of input transistors 172 to maintain a linear current relationship with an input voltage received at gate terminals of MOSFETs 174 and 176. Generally, the degeneration circuitry is operable to provide unity gain at the drain terminals of MOSFETs 202 and 204, in terms of output voltage, but to provide a linear output current based on an input voltage. The linear current is then conducted through input MOSFETs 202 and 204 of current mirror block 206. Current mirror block 206 further includes output MOSFETs 208 and 210 that provide a proportional or scaled current based upon current conducted through MOSFETs 202 and 204, respectively.

Generally, by utilizing MOSFETs 208 and 210 that have a scaled physical characteristic, for example, scaled channel width, in relation to a corresponding physical characteristic of MOSFETs 202 and 204, respectively, a scaled or proportional current may be produced. Accordingly, a net result is that a scaled or proportional amplified output current is produced based upon the current conducted through the channels of MOSFETs 202 and 204. Because the current conducted through MOSFETs 202 and 204 has been linearized, the output of current mirror block 206 is an amplified and linearized output current that is then mixed with quad MOSFETs of a mixer block 212.

Continuing to refer to FIG. 6, mixer block 212 includes four MOSFET transistors coupled to receive a positive and negative differential input of a local oscillation. Specifically, gate terminals of MOSFETs 214 and 216 are commonly coupled to receive the negative input of the local oscillation while the gate terminals of MOSFETs 218 and 220 are coupled to receive the positive inputs of the local oscillation. It is understood, of course, that references to positive and negative with respect to a differential input are well understood to mean that each input is opposite of the other input. These references do not actually mean that one input is always positive and the other is always negative.

The outputs of MOSFETs 218 and 216 (at their respective drain terminals) are commonly coupled to a load 222, while the output of MOSFETs 214 and 220 (at their respective drain terminals) are coupled to a load 224. As is known by one of average skill in the art, the output terminals of such MOSFET transistor amplifiers is often coupled to the drain terminals of such devices. Moreover, as shown here in FIG. 6, load devices 222 and 224 comprise inductors that may be selected to tune a response to a specified frequency. Advantageously, using such inductors may provide beneficial filtering.

In operation, the feedback circuit paths 184 and 186, in conjunction with degeneration resistors 177, operate to linearize a voltage to current relationship for an input voltage received at input transistors 172. Thereafter, current mirror block 206 operates to amplify the current output produced by input transistors 172 by a scaled amount that is a function of relative channel dimensions of MOSFETs 208 and 210 in relation to MOSFETs 202 and 204. The amplified current signal produced by MOSFETs 208 and 210 is mixed with the local oscillation (differential) received by mixer block 212. The output of mixer 170 is then output from nodes coupling inductive loads 222 and 224 to mixer block 212. As such, a linear amplified current having increased current capacity may be mixed with a differential oscillation (in the described embodiment of the invention) to produce one of an up-converted or down-converted signal.

Figure 7:
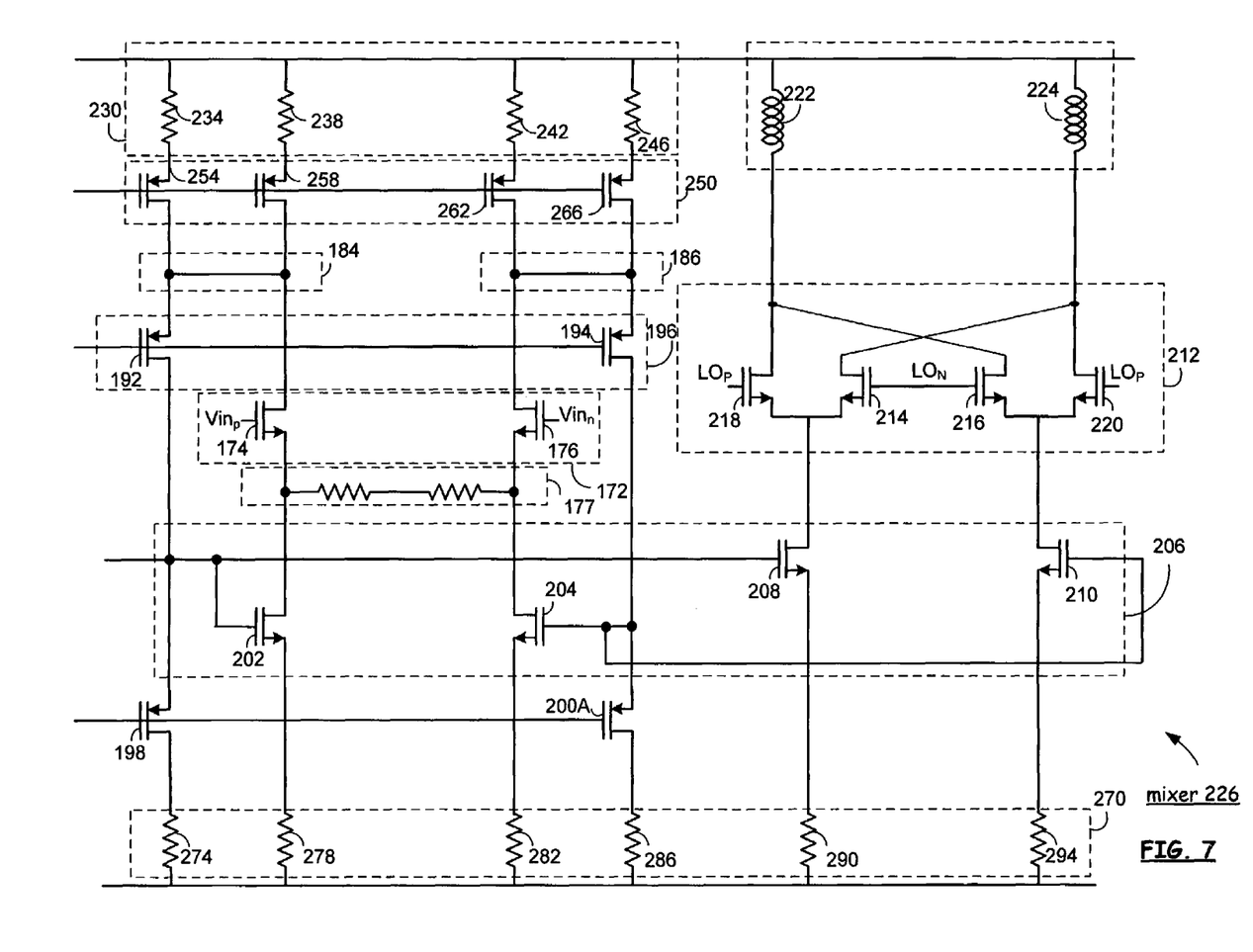
FIG. 7 is a functional schematic diagram of a mixer block according to one embodiment of the invention.

FIG. 7 is a functional schematic diagram of a mixer block according to one embodiment of the invention. Mixer 226 includes a differential input transistor pair, referenced herein as input transistors 172 $Vin_p$ and $Vin_n$, which are operably coupled to receive a differential input voltage signal and are similar to input transistors 172 of FIG. 6. Input transistors 172 and all other components of FIG. 7 having common reference numerals to components in FIG. 6 are similar. Specifically, input transistors 172 include MOSFETs 174 and 176 which, in the described embodiment of the invention, are n-channel MOSFETs. The input transistors 172 are coupled to degeneration resistors 177 that are coupled in series and, as a pair, connect the source terminals of MOSFET transistors 174 and 176. The drain terminals of MOSFETs 174 and 176 are coupled directly to a biasing block 250 as will be described below.

The drain terminals of MOSFETs 174 and 176 are coupled to the source terminals of MOSFETs 192 and 194 of biasing circuit 196 by way of feedback circuit paths 184 and 186, respectively. MOSFETs 192 and 194 are p-channel MOS- FETs whose gate terminals are operatively coupled to a biasing voltage to operatively bias MOSFETs 192 and 194 and are operably coupled as cascode devices. The drain terminals of MOSFETs 192 and 194 are coupled to current sinks 198 and 200, respectively, and to gate terminals of MOSFETs 202 and 204 of current mirror block 206. The drain terminals of MOSFETs 202 and 204 are also coupled to a common node that is further coupled to degeneration resistors 177 and the source terminals of MOSFETs 174 and 176 of input transistors 172. In an alternate configuration, current sinks 198 and 200 are replaced by MOSFETs in a current mirror configuration operably disposed to sink a specified amount of current. Any reference to current mirrors 198 and 200 specifically includes this alternate configuration. Thus, current sinks 198 and 200 each comprise a transistor disposed as a current mirror device whose channel is coupled in series with a resistor 274 and 286 respectively as shown in FIG. 7. One of average skill in the art may readily utilize such a current mirror configuration to operate as a current sink according to design requirements. This configuration is equally applicable to the embodiment of FIG. 6.

In operation, the circuitry described above includes a degeneration circuit that comprises feedback circuit paths 184 and 186, as well as degeneration resistors 177. The plurality of current sources of current biasing block 250 and current sinks 198 and 200, are operable to steer current in and out of the drain terminals of MOSFETs 174 and 176 of input transistors 172 to maintain a linear current relationship with an input voltage received at gate terminals of MOSFETs 174 and 176. Generally, the degeneration circuitry is operable to provide unity gain, in terms of output voltage, but to provide a linear output current based on an input voltage. The linear current is then conducted through input MOSFETs 202 and 204 of current mirror block 206. Current mirror block 206 further includes output MOSFETs 208 and 210 that provide a proportional or scaled current based upon current conducted through MOSFETs 202 and 204, respectively.

Generally, by utilizing MOSFETs 208 and 210 that have a scaled physical characteristic, for example, scaled channel width, in relation to a corresponding physical characteristic of MOSFETs 202 and 204, respectively, a scaled or proportional current may be produced. Accordingly, a net result is that a scaled or proportional amplified output current is produced based upon the current conducted through the channels of MOSFETs 202 and 204. Because the current conducted through MOSFETs 202 and 204 has been linearized, the output of current mirror block 206 is an amplified and linearized output current that is then mixed with quad MOSFETs of a mixer block 212.

Continuing to refer to FIG. 7, mixer block 212 includes four MOSFET transistors coupled to receive a positive and negative differential input of a local oscillation. Specifically, gate terminals of MOSFETs 214 and 216 are commonly coupled to receive the negative input of the local oscillation while the gate terminals of MOSFETs 218 and 220 are coupled to receive the positive inputs of the local oscillation. It is understood, of course, that references to positive and negative with respect to a differential input are well understood to mean that each input is opposite of the other input. These references do not actually mean that one input is always positive and the other is always negative.

The outputs of MOSFETs 218 and 216 (at their respective drain terminals) are commonly coupled to a load 222, while the output of MOSFETs 214 and 220 (at their respective drain terminals) are coupled to load 224. As is known by one of average skill in the art, the output terminals of such MOSFET transistor amplifiers is often coupled to the drain terminals of such devices. Moreover, as shown here in FIG. 7, load devices 222 and 224 comprise inductors that may be selected to tune a response to a specified frequency. Advantageously, using such inductors may provide beneficial filtering.

In addition to the above described circuitry, FIG. 7 includes a degeneration resistor block 230 that further includes resistors 234, 238, 242 and 246. Degeneration resistor block 230 is generally operable to provide additional linearization of output current levels and/or better matching. Additionally, the resistors of degeneration resistor block 230 are each coupled to a commonly biased MOSFET transistor of biasing block 250. More specifically, resistor 234 is coupled to a source terminal of p-channel MOSFET 254. Resistor 238 is coupled to a source terminal of MOSFET 258. Resistor 242 is coupled to a source terminal of MOSFET 262 and resistor 246 is coupled to a source terminal of MOSFET 266. A gate terminal of each of the MOSFETs 254-266 are commonly coupled to a bias voltage to provide an equal bias for each MOSFET. In the described embodiment, each of the MOSFETS 254-266 are matched. The drain terminals of each of the MOSFETS 254-266 are coupled as shown here in FIG. 7 to the previously described circuitry. Similarly, a degeneration resistor block 270 comprising resistors 274-294 are coupled between circuit common and each branch coupled to circuit common as shown to provide additional degeneration. The drain terminals of MOSFETs 258 and 262 are also coupled to the drain terminals of inputs MOSFETs 174 and 176.

In operation, the feedback circuit paths 184 and 186 in conjunction with degeneration resistors 177, and degeneration resistor blocks 230 and 270, jointly operate to linearize a voltage to current relationship for an input voltage received at input transistors 172 and to reduce noise to provide a cleaner mixer 226 output. Current mirror block 206 operates to amplify the current output produced by input transistors 172 by a scaled amount that is a function of relative channel dimensions of MOSFETs 208 and 210 in relation to MOSFETs 202 and 204. The amplified current signal produced by MOSFETs 208 and 210 is mixed with the local oscillation (differential) received by a mixer block 212. The output of mixer 170 is then output from nodes coupling inductive loads 222 and 224 to mixer block 212. As such, a linear amplified current having increased current capacity may be mixed with a differential oscillation (in the described embodiment of the invention) to produce one of an up-converted or down-converted signal.

One aspect of the above described embodiment of the invention is that the circuitry is operable to provide more headroom that other known designs. Particularly, the embodiments of FIGS. 6 and 7, for example, include MOSFETs 258, 192 and 202 that provide a signal path between supply and circuit common that provide voltage drops of $V_{dsat}$, $V_{dsat}$ and $V_{gs}$, respectively, because of the folded cascode (common gate) configuration in the linearization circuitry. $V_{dsat}$ is the saturation voltage of the channel and defines the voltage drop for the configuration as shown for MOSFETs 258 and 192. $V_{gs}$ is the gate-to-source voltage and defines the voltage drop for the configuration as shown for MOSFET 202. Because $V_{dsat}$ is typically a lower magnitude voltage drop than $V_{gs}$, the total voltage drop in the signal path is reduced thereby creating more headroom for circuit operation. As an additional aspect of the invention, additional linearization is provided by first and second degeneration resistor blocks 230 and 270 that include resistors 234-246 and 274-294, respectively. By providing a linearization circuit with the elements described in the embodiment of FIG. 7, shorter channels may be used for the MOSFETs for the benefit of having higher frequency response. While shortening the channel length improves frequency response, it also adds more flicker noise. A linearization circuit such as that shown in FIG. 7, however, by providing additional linearization, is more noise tolerant because it reduces flicker noise on the output signal thereby allowing for design of short channel length MOSFETs within the circuitry. Thus, the circuit of FIG. 7 provides improved headroom and linearization (noise tolerance).

With respect to the mixer embodiments described above, each may be used according to design requirements in the systems of FIGS. 2-4. Thus, the embodiments of the mixers of FIG. 5, 6 and 7, may each be used within the circuit of FIG. 3 in the down conversion module 70 or up-conversion module 82. Similarly, they may be used in the RF transmitters 108-110 or in the RF receivers 118-120 of FIG. 4.

Figure 8:
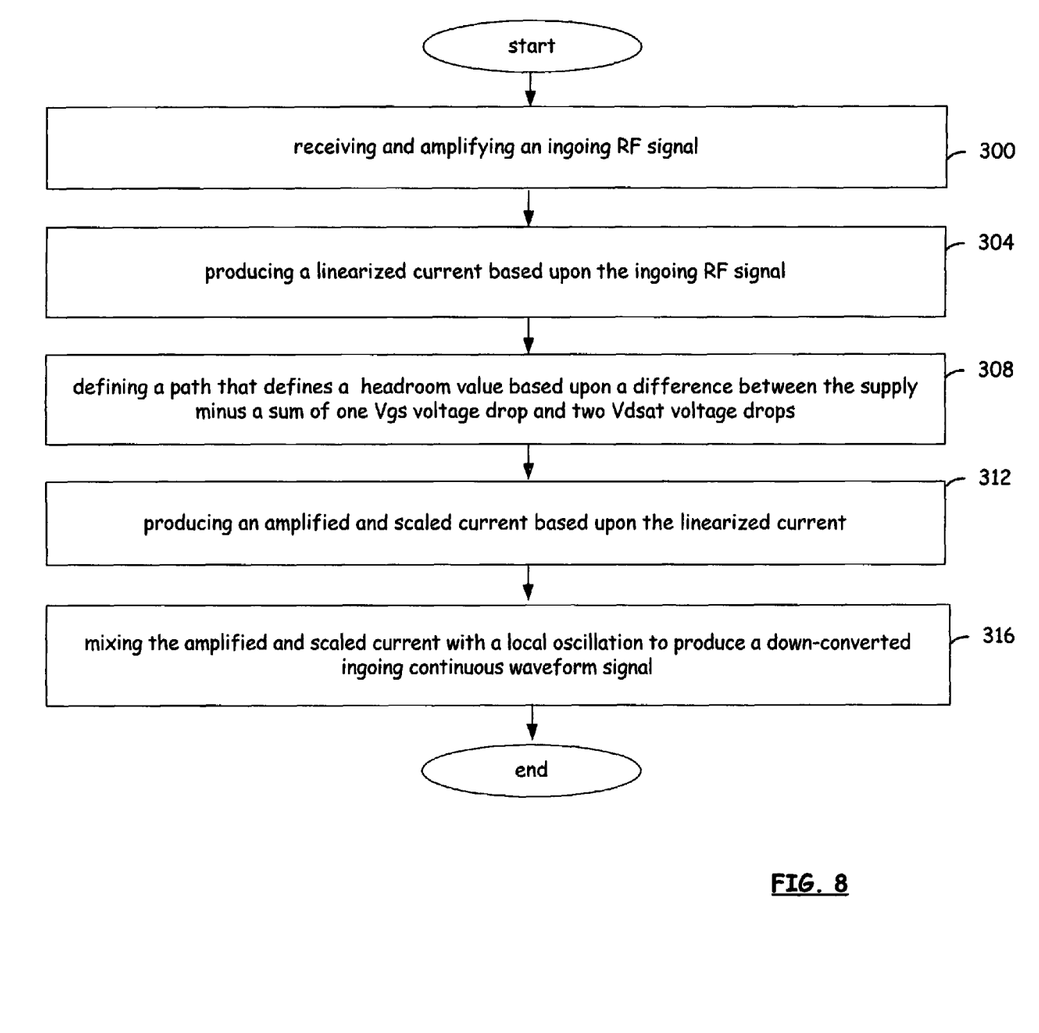
FIG. 8 is a flowchart that illustrates one method of an embodiment of the present invention for down-converting an ingoing RF signal.

FIG. 8 is a flowchart that illustrates one method of an embodiment of the present invention for down-converting an ingoing RF signal. Initially, the method includes receiving and amplifying an ingoing RF signal (step 300). Typically, a radio receiver includes a low noise amplifier that receives the RF signal and amplifies the RF signal to facilitate further processing. Subsequent to such amplification, the method includes producing a linearized current based upon the ingoing RF signal (step 304). The method of producing a linearized current is as described above in relation to FIGS. 6 and 7. In one embodiment, the method also includes defining a path from supply to circuit common through the linearization circuit, which path defines a headroom value based upon a difference between the supply minus a sum of one Vgs voltage drop and two Vdsat voltage drops (step 308).

Thereafter, the method includes producing an amplified and scaled current based upon the linearized current (step 312). In the described embodiments of the invention, the amplified and scaled current is produced with a current mirror whose output is based upon the linearized current produced in step 304. Finally, the method includes mixing the amplified and scaled current with a local oscillation to produce a down-converted ingoing continuous waveform signal (step 316). As is known by one of average skill in the art, a local oscillation is generated to facilitate producing a desired intermediate or baseband frequency ingoing signal for a specified ingoing RF signal frequency.

Figure 9:
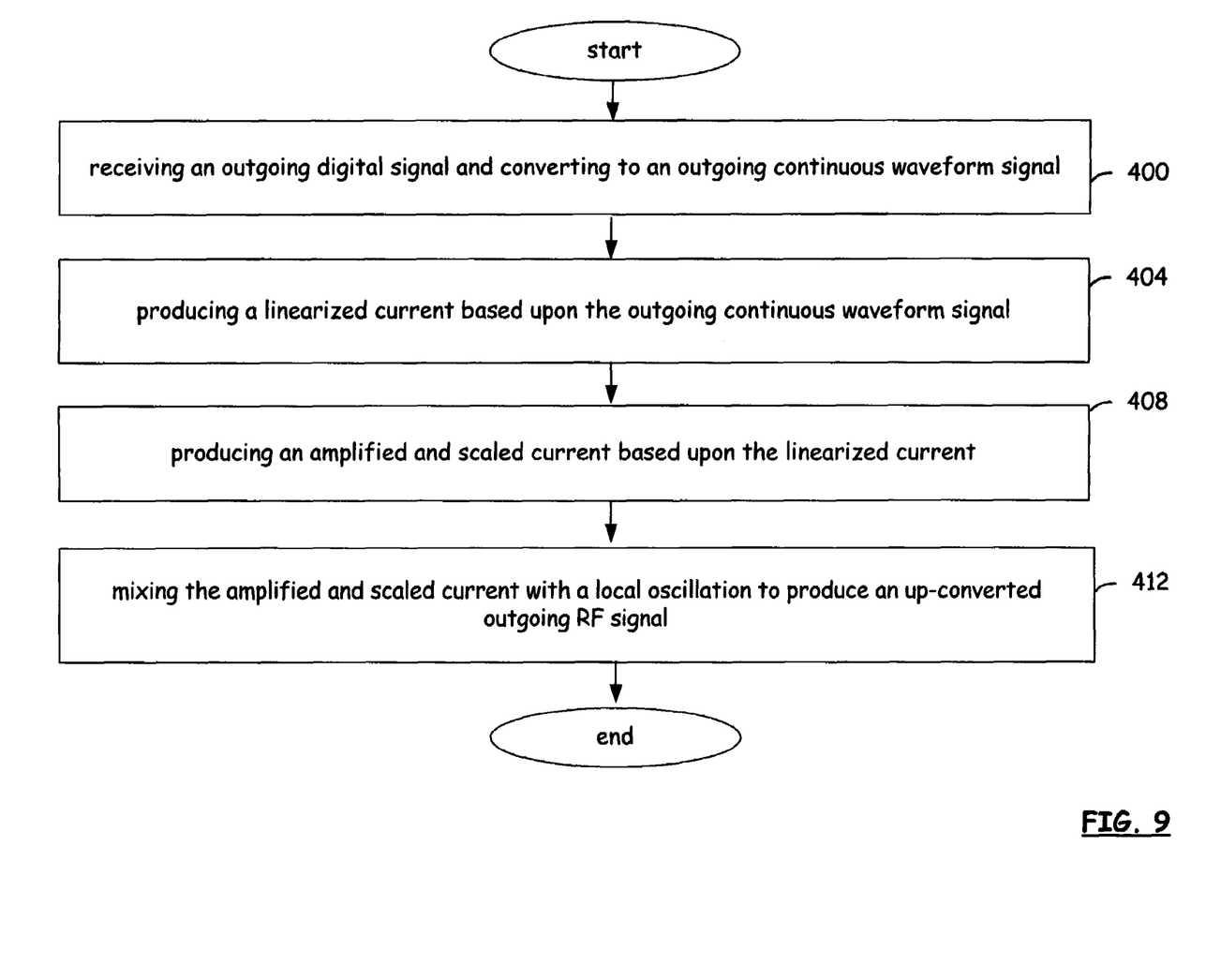
FIG. 9 is a flowchart that illustrates one method of an embodiment of the present invention for producing an outgoing RF signal.

FIG. 9 is a flowchart that illustrates one method of an embodiment of the present invention for producing an outgoing RF signal. Specifically, the method includes receiving an outgoing digital signal and converting the outgoing digital signal to an outgoing continuous waveform signal (step 400). Thereafter, the method includes producing a linearized current based upon the outgoing continuous waveform signal (step 404). Thereafter, the method includes producing an amplified and scaled current based upon the linearized current (step 408). Finally, the method includes mixing the amplified and scaled current with a local oscillation to produce an up-converted outgoing RF signal (step 412). As before, the steps of producing a linearized current is based upon at least one of using a pair of degeneration resistors or a feedback path that is operable to steer current in or out of an output of an input transistor pair. In at least one embodiment of the invention, the combination of degeneration resistors and a current steering mechanism is employed.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. An integrated circuit radio transceiver, comprising:
    a baseband processor for processing ingoing and outgoing digital signals;
    a radio front end for receiving RF and for producing the ingoing digital signals to the baseband processor and for receiving the outgoing digital signals from the baseband processor and producing outgoing RF;
    the radio front end further including a mixer block operable to down-convert from RF or up-convert to RF based upon whether the radio front end is processing ingoing RF or outgoing RF, respectively;
    wherein the mixer block further includes:
        linearization circuitry operable to receive an input voltage signal comprising one of the ingoing RF or outgoing continuous waveform signals and to produce a linearized input current signal based upon one of the ingoing RF or the outgoing continuous waveform signals, the linearization circuitry comprising a signal path that includes a plurality of MOSFET transistors operably disposed therein to provide a headroom voltage that is substantially equal to a supply voltage minus a sum of one gate-to-source voltage (Vgs) voltage drop and two saturation voltage (Vdsat) voltage drops;
        current mirror circuitry operable to produce an amplified current based upon the linearized input current signal;
        mixer circuitry operable to mix the amplified current with a local oscillation to produce a mixer output signal comprising one of downconverted ingoing continuous waveform signals or upconverted RF signals; and
        conversion circuitry operably disposed to produce the outgoing continuous waveform signals based upon the outgoing digital signals produced by the baseband processor and to produce ingoing digital signals based upon the ingoing continuous waveform signals.

2. The integrated circuit radio transceiver of claim 1 wherein the linearization circuitry comprises a pair of input MOSFET transistors having a degeneration resistor pair operably disposed between source terminals of the pair of input MOSFET transistors which are operable to produce a linearized current based upon an input voltage magnitude of an input signal received at gate terminals of the pair of input MOSFET transistors.

3. The integrated circuit radio transceiver of claim 2 further comprising a feedback loop coupled to the pair of input MOSFET transistors, which feedback loop is operable to steer current in and out of the pair of input MOSFET transistors to further linearize the current produced through the degeneration resistor pair coupled to the source terminals of the pair of input MOSFET transistors.

4. The integrated circuit radio transceiver of claim 3 further wherein the current mirror circuitry is operably disposed to produce a scaled current as the amplified current based upon the linearized current passing through the linearization circuitry.

5. The integrated circuit radio transceiver of claim 4 wherein the current mirror circuitry is operably coupled to a mixer to provide the scaled current for mixing with the local oscillation to upconvert an outgoing signal to RF or to down-convert an ingoing RF signal to one of an intermediate or baseband frequency signal.

6. The integrated circuit radio transceiver of claim 5 wherein the current mirror circuitry comprises MOSFET transistors having channel dimensions to provide the amplified current based upon the linearized current in a scaled ratio based upon a scaled ratio of the MOSFET transistors of the current mirror in relation to specified transistors that conduct the linearized current.

7. The integrated circuit radio transceiver of claim 1 wherein the linearization circuitry farther includes a first degeneration resistor block further including a plurality of resistors each coupled between a supply and a corresponding MOSFET of a biasing block.

8. The integrated circuit radio transceiver of claim 1 including a second degeneration resistor block further including a plurality of resistors each coupled between a circuit common and a corresponding signal path of the linearization circuitry and of the mixer circuitry.

9. The integrated circuit radio transceiver of claim 1 further including matching and flicker noise reduction means operably disposed to linearize output current levels and to reduce output noise.

10. The integrated circuit radio transceiver of claim 1 wherein the headroom voltage that is substantially equal to a supply voltage minus a sum of one Vgs voltage drop and two Vdsat voltage drops improves linearization of the linearized input current signal.

11. A radio receiver, comprising:
a radio front end for receiving RF and for producing ingoing digital signals;
the radio front end further including:
a low noise amplifier operable to receive and amplify and RF signals to produce an ingoing input signal;
a mixer block operable to downconvert the ingoing input signal from RF to one of an intermediate or baseband frequency signal to produce downconverted ingoing signals;
analog-to-digital conversion circuitry operably disposed to produce the ingoing digital signals based upon the downconverted ingoing signals;
a baseband processor for processing the ingoing digital signals; and
wherein the mixer block further includes:
linearization circuitry operable to receive the ingoing input signal and to produce a linearized input current signal, the linearization circuitry comprising a signal path that includes a plurality of MOSFET transistors operably disposed therein to provide a headroom voltage that is substantially equal to a supply voltage minus a sum of one gate-to-source voltage (Vgs) voltage drop and two saturation voltage (Vdsat) voltage drops;
current mirror circuitry operable to produce an amplified current based upon the linearized input current signal; and
mixer circuitry operable to mix the amplified current with a local oscillation to produce the downconverted ingoing signals.

12. The radio receiver of claim 11 wherein the linearization circuitry comprises a pair of input MOSFET transistors having a resistor pair operably disposed between source terminals of the pair of input MOSFET transistors wherein the resistor pair are degeneration resistors which are operable to produce a linearized current based upon an input voltage magnitude of the ingoing input signal received at gate terminals of the pair of input MOSFET transistors.

13. The radio receiver of claim 12 further comprising a feedback loop coupled to the pair of input MOSFET transistors, which feedback loop is operable to steer current in and out of the pair of input MOSFET transistors to further linearize the current produced through the degeneration resistor pair coupled to the source terminals of the pair of input MOSFET transistors.

14. The radio receiver of claim 13 wherein the current mirror circuitry operably is disposed to produce a scaled current as the amplified current based upon the linearized current passing through the linearization circuitry.

15. The radio receiver of claim 14 wherein the current mirror circuitry is operably coupled to a mixer to provide the scaled current for mixing with the local oscillation to downconvert the ingoing input signal to one of an intermediate or baseband frequency signal from RF.

16. The radio receiver of claim 15 wherein the current mirror circuitry comprises MOSFET transistors having channel dimensions to provide the amplified current based upon the linearized current in a scaled ratio based upon a scaled ratio of the MOSFET transistors of the current mirror circuitry in relation to specified transistors that conduct the linearized current.

17. The radio receiver of claim 15 wherein the linearization circuitry further includes a first degeneration resistor block further including a plurality of resistors each coupled between a supply and a corresponding MOSFET of a biasing block.

18. The radio receiver of claim 15 including a second degeneration resistor block further including a plurality of resistors each coupled between a circuit common and a corresponding signal path of the linearization circuitry and of the mixer circuitry.

19. The radio receiver of claim 11 wherein the headroom voltage that is substantially equal to a supply voltage minus a sum of one Vgs voltage drop and two Vdsat voltage drops improves linearization of the linearized input current signal.

20. A method for processing an ingoing RF signal, comprising:
receiving and amplifying an ingoing RF signal;
producing, within a linearization circuit, a linearized current based upon the ingoing RF signal;
conducting a signal from supply to circuit common through the linearization circuit, which path defines a headroom value based upon a difference between a supply minus a sum of one gate-to-source voltage (Vgs) voltage drop and two saturation voltage (Vdsat) voltage drops;
producing an amplified and scaled current based upon the linearized current; and
mixing the amplified and scaled current with a local oscillation to produce a down-converted ingoing continuous waveform signal.

21. The method of claim 20 wherein the step of producing a linearized current includes conducting a transconductance current through at least one degeneration resistor.

22. The method of claim 20 wherein the step of producing a linearized current further includes conducting the current through a unity gain amplifier.

23. The method of claim 20 further including using a feedback current path to operably steer current in and out of at least one degeneration resistor.

24. The method of claim 20 wherein the headroom value based upon a difference between the supply minus a sum of one Vgs voltage drop and two Vdsat voltage drops.

25. A method for processing an outgoing continuous waveform signal, comprising:

receiving an outgoing digital signal and converting the outgoing digital signal to an outgoing continuous waveform signal;

conducting a signal from supply to circuit common through a linearization circuit, and establishing a headroom value based upon a difference between a supply minus a sum of one gate-to-source voltage (Vgs) voltage drop and two saturation voltage (Vdsat) voltage drops and producing a linearized current based upon the outgoing continuous waveform;

producing an amplified and scaled current based upon the linearized current; and upconverting the outgoing continuous waveform signal to an outgoing radio frequency signal based upon a local oscillation and upon the amplified and scaled current which is further based upon the linearized current.

26. The method of claim 25 wherein the step of producing the linearized current includes conducting a transconductance current through at least one degeneration resistor.

27. The method of claim 25 wherein the step of producing the linearized current further includes conducting the current through a unity gain amplifier.

28. The method of claim 25 further including using a feedback current path to operably steer current in and out of at least one degeneration resistor.

29. The method of claim 25 wherein the headroom value based upon the difference between a supply minus a sum of one gate-to-source voltage (Vgs) voltage drop and two saturation voltage (Vdsat) voltage drops improves linearization.

* * * * *